United States Patent
Zan et al.

(10) Patent No.: US 11,114,570 B2
(45) Date of Patent: Sep. 7, 2021

(54) MEMORY STRUCTURE AND MANUFACTURING METHOD THEREOF

(71) Applicant: E Ink Holdings Inc., Hsinchu (TW)

(72) Inventors: Hsiao-Wen Zan, Hsinchu (TW); Chuang-Chuang Tsai, Hsinchu (TW); Ching-Fu Lin, Hsinchu (TW); Zong-Xuan Li, Hsinchu (TW); Wei-Tsung Chen, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 4 days.

(21) Appl. No.: 16/846,393

(22) Filed: Apr. 12, 2020

(65) Prior Publication Data

US 2020/0343385 A1 Oct. 29, 2020

(30) Foreign Application Priority Data

Apr. 25, 2019 (TW) ................................. 108114563

(51) Int. Cl.
*H01L 29/788* (2006.01)
*H01L 29/12* (2006.01)
(Continued)

(52) U.S. Cl.
CPC .... *H01L 29/7883* (2013.01); *H01L 21/02565* (2013.01); *H01L 21/02601* (2013.01); *H01L 21/02631* (2013.01); *H01L 29/127* (2013.01); *H01L 29/24* (2013.01); *H01L 29/40114* (2019.08); *H01L 29/42332* (2013.01);
(Continued)

(58) Field of Classification Search
None
See application file for complete search history.

(56) References Cited

U.S. PATENT DOCUMENTS 7,745,874 B2 * 6/2010 Lee .................. B82Y 10/00
257/325
8,664,051 B2 3/2014 Lee
(Continued)

FOREIGN PATENT DOCUMENTS

CN 105448929 B 7/2018
CN 109074779 A 12/2018
(Continued)

OTHER PUBLICATIONS

Jiin Yu et al., "Photomodulation of InGaZnO thin film transistors with interfacial silver nanoparticles", Japanese Journal of Applied Physics, vol. 55, Oct. 6, 2016.
(Continued)

*Primary Examiner* — Bo B Jang
(74) *Attorney, Agent, or Firm* — CKC & Partners Co., LLC

(57) ABSTRACT

A memory structure includes a substrate, a gate electrode, a first isolation layer, a thin metal layer, indium gallium zinc oxide (IGZO) particles, a second isolation layer, an IGZO channel layer, and a source/drain electrode. The gate electrode is located on the substrate. The first isolation layer is located on the gate electrode. The thin metal layer is located on the first isolation layer, and has metal particles. The IGZO particles are located on the metal particles. The second isolation layer is located on the IGZO particles. The IGZO channel layer is located on the second isolation layer. The source/drain electrode is located on the IGZO channel layer.

14 Claims, 6 Drawing Sheets

(51) Int. Cl.
*H01L 29/24* (2006.01)
*H01L 29/423* (2006.01)
*H01L 29/786* (2006.01)
*H01L 29/66* (2006.01)
*H01L 21/02* (2006.01)
*H01L 21/28* (2006.01)

(52) U.S. Cl.
CPC .... *H01L 29/66969* (2013.01); *H01L 29/7869* (2013.01); *H01L 29/78696* (2013.01)

(56) References Cited

U.S. PATENT DOCUMENTS

| | | |
|---|---|---|
| 8,766,250 B2 | 7/2014 | Miyanaga et al. |
| 8,927,330 B2 | 1/2015 | Zan et al. |
| 8,932,929 B2 | 1/2015 | Ding et al. |
| 8,963,149 B2 | 2/2015 | Miyanaga et al. |
| 9,647,129 B2 * | 5/2017 | Kurata ................ H01L 21/8258 |
| 10,236,306 B2 | 3/2019 | Yamazaki et al. |
| 10,768,137 B2 * | 9/2020 | Jeong ................. G01N 27/4146 |
| 10,978,489 B2 * | 4/2021 | Hirakata ............. H01L 27/1255 |
| 2008/0106191 A1 * | 5/2008 | Kawase .............. H01L 51/5253 313/504 |
| 2012/0056175 A1 * | 3/2012 | Takemura ......... H01L 29/42324 257/43 |
| 2015/0140734 A1 | 5/2015 | Cho et al. |
| 2017/0154905 A1 | 6/2017 | Yuan et al. |

FOREIGN PATENT DOCUMENTS

| | | |
|---|---|---|
| KR | 101355813 B1 | 1/2014 |
| TW | 201532197 A | 8/2015 |

OTHER PUBLICATIONS

Hung-Chuan Liu et al., "High Effective Field-Effect Mobility Amorphous InGaZnOTFT Mediated by Directional Silver Nanowire Arrays", ACS Appled Materials & Interfaces, Dec. 8, 2014.
Corresponding Taiwan Notice of Allowance dated Nov. 25, 2019.

* cited by examiner

MEMORY STRUCTURE AND MANUFACTURING METHOD THEREOF

RELATED APPLICATIONS

This application claims priority to Taiwan Application Serial Number 108114563, filed Apr. 25, 2019, which is herein incorporated by reference.

BACKGROUND

Field of Invention

The present invention relates to a memory structure and a manufacturing method of the memory structure.

Description of Related Art

Nowadays, electronic products, such as smart phones, portable computers, tablet computers, USB flash drives, and digital cameras, have served as indispensable tools in our daily lives. Memories in the electronic products play important roles. There are two types of the memories including a volatile memory and a non-volatile memory.

The volatile memory is referred to as a memory in which data is erased when an external power is removed, such as a static random access memory (SRAM) and a dynamic random access memory (DRAM). The non-volatile memory is referred to as a memory in which data is not erased when an external power is removed, such that the memory may be saved for a long time, such as a read-only memory (ROM), a programmable ROM (PROM), an electrically-erasable programmable read-only memory (EEPROM), and a flash memory.

In order to store the information carried by charge carriers for long time in a non-volatile memory, it is an important topic to reduce the lateral leakage of a component, so as to ensure that the component can operate in a normal status for long time and information loss can be prevented.

SUMMARY

An aspect of the present invention is to provide a memory structure.

According to an embodiment of the present invention, a memory structure includes a substrate, a gate electrode, a first isolation layer, a thin metal layer, a plurality of indium gallium zinc oxide (IGZO) particles, a second isolation layer, an IGZO channel layer, and a source/drain electrode. The gate electrode is located on the substrate. The first isolation layer is located on the gate electrode. The thin metal layer is located on the first isolation layer and has a plurality of metal particles. The IGZO particles are located on the metal particles. The second isolation layer is located on the IGZO particles. The IGZO channel layer is located on the second isolation layer. The source/drain electrode is located on the IGZO channel layer.

In one embodiment of the present invention, a thickness of the thin metal layer is in a range from 1 nm to 20 nm.

In one embodiment of the present invention, a thickness of each of the IGZO particles is in a range from 2 nm to 20 nm.

In one embodiment of the present invention, the thin metal layer is made of a material including silver.

In one embodiment of the present invention, the IGZO particles are in contact with the thin metal layer.

In one embodiment of the present invention, the thin metal layer is in contact with the first isolation layer.

In one embodiment of the present invention, the IGZO particles are located between the thin metal layer and the second isolation layer.

An aspect of the present invention is to provide a manufacturing method of a memory structure.

According to an embodiment of the present invention, a manufacturing method of a memory structure includes forming a thin metal layer on a first isolation layer that is on a gate electrode; performing a thermal annealing treatment on the thin metal layer such that the thin metal layer has metal particles; forming a indium gallium zinc oxide (IGZO) material on the metal particles such that the IGZO material forms IGZO particles; forming a second isolation layer on the IGZO particles; forming a IGZO channel layer on the second isolation layer; and forming a source/drain electrode on the IGZO channel layer.

In one embodiment of the present invention, forming the thin metal layer on the first isolation layer is performed by thermal evaporation.

In one embodiment of the present invention, the thermal annealing treatment is performed on the thin metal layer under a temperature that is in a range from 50° C. to 300° C.

In one embodiment of the present invention, forming the IGZO material on the metal particles is performed by sputtering.

In one embodiment of the present invention, a thickness of the thin metal layer is in a range from 1 nm to 20 nm.

In one embodiment of the present invention, a thickness of each of the IGZO particles is in a range from 2 nm to 20 nm.

In one embodiment of the present invention, the thin metal layer is made of a material including silver.

In the aforementioned embodiments of the present invention, because the memory structure has the thin metal layer that is on the first isolation layer, and the thin metal layer has the metal particles, when the IGZO material is formed on the metal particles, the IGZO material may form the IGZO particles. The IGZO particles may act as a medium to store charge carriers (electrons) that is induced by a tunneling effect, and can reduce the lateral leakage of the memory structure, thereby ensuring that the memory structure can operate in a normal status for long time and information loss can be prevented.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
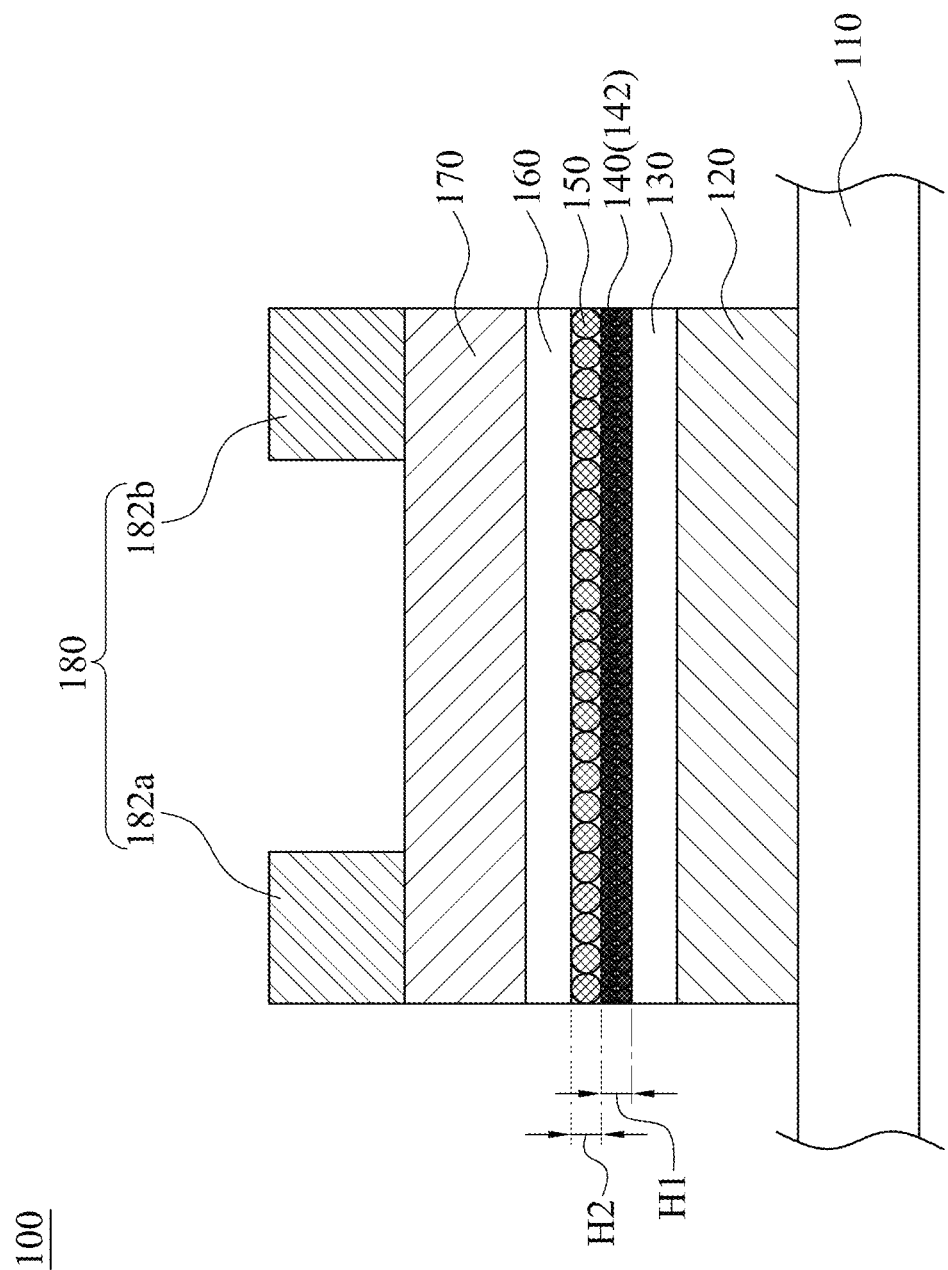
FIG. 1 is a cross-sectional view of a memory structure according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a memory structure 100 according to one embodiment of the present invention. As shown in FIG. 1, the memory structure 100 includes a substrate 110, a gate electrode 120, a first isolation layer 130, a thin metal layer 140, indium gallium zinc oxide (IGZO) particles 150, a second isolation layer 160, an IGZO channel layer 170, and a source/drain electrode 180. The gate electrode 120 is located on the substrate 110. The first isolation layer 130 is located on the gate electrode 120. The thin metal layer 140 is located on the first isolation layer 130, and has metal particles 142. The IGZO particles 150 are located on the metal particles 142. It is noted that the sizes and arrangements of the metal particles 142 and the IGZO particles 150 shown in FIG. 1 are merely for illustration. The second isolation layer 160 is located on the IGZO particles 150. In other words, the IGZO particles 150 are located between the thin metal layer 140 and the second isolation layer 160. The IGZO channel layer 170 is located on the second isolation layer 160. The source/drain electrode 180 is located on the IGZO channel layer 170. The source/drain electrode 180 includes a source region 182a and a drain region 182b.

In this embodiment, the memory structure 100 may be a non-volatile memory (NVM), and may be a floating gate memory. The thin metal layer 140 may be made of a material including silver, and may be a silver metal layer. A thickness H1 of the thin metal layer 140 may be in a range from 1 nm to 20 nm, such as 10 nm. The thin metal layer 140 may be referred to as a structure of nano-silver particles. The IGZO particles 150 are substantially sphere-shaped. A thickness H2 of each of the IGZO particles 150 is in a range from 2 nm to 20 nm. The first isolation layer 130 and the second isolation layer 160 may made of the same material. For example, the first isolation layer 130 and the second isolation layer 160 both include $SiO_2$, but the present invention is not limited in this regard.

Because the memory structure 100 has the thin metal layer 140 that is on the first isolation layer 130, and the thin metal layer 140 has the metal particles 142, when the IGZO material is formed on the metal particles 142, the IGZO material may form the IGZO particles 150. The IGZO particles 150 may act as a medium to store charge carriers (electrons) that is induced by tunneling effect, and can reduce the lateral leakage of the memory structure 100, thereby ensuring that the memory structure 100 can operate in a normal status for long time and the loss of information is prevented.

Figure 2:
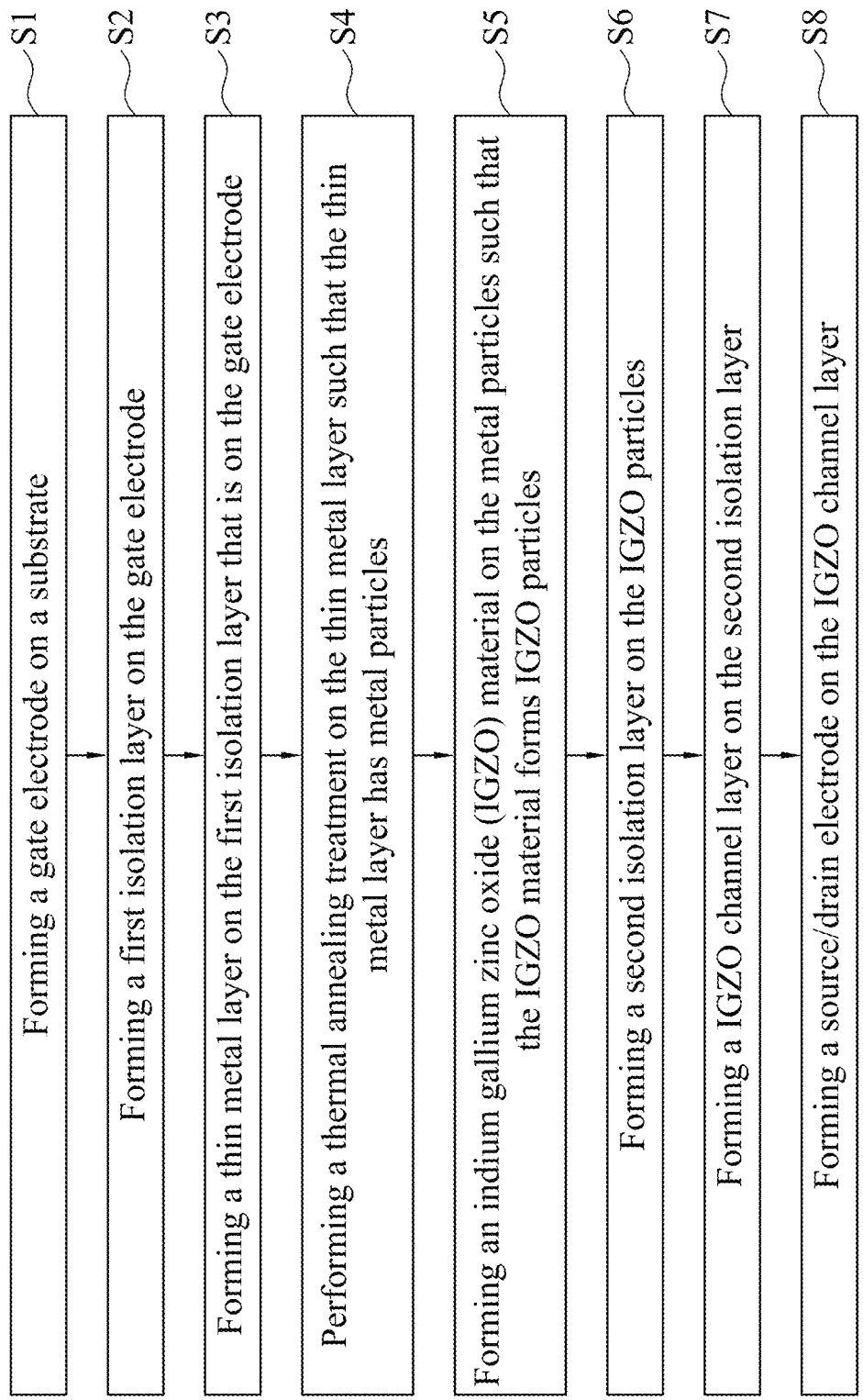
FIG. 2 is a flow chart showing a manufacturing method of the memory structure of FIG. 1.

FIG. 2 is a flow chart showing a manufacturing method of the memory structure 100 of FIG. 1. The manufacturing method of the memory structure 100 includes the following steps. In step S1, a gate electrode is formed on a substrate. Thereafter, in step S2, a first isolation layer is formed on the gate electrode. Next, in step S3, a thin metal layer is formed on the first isolation layer that is on the gate electrode. Subsequently, in step S4, a thermal annealing treatment is performed on the thin metal layer such that the thin metal layer has metal particles. Afterwards, in step S5, an indium gallium zinc oxide (IGZO) material is formed on the metal particles such that the IGZO material forms IGZO particles. Thereafter, in step S6, a second isolation layer is formed on the IGZO particles. Next, in step S7, an IGZO channel layer is formed on the second isolation layer. Thereafter, in step S8, a source/drain electrode is formed on the IGZO channel layer.

In the following description, the aforementioned steps will be explained.

As shown in FIG. 1 and FIG. 2, the gate electrode 120 and the first isolation layer 130 are sequentially formed on the substrate 110, and thus the first isolation layer 130 is located on the gate electrode 120. The gate electrode 120 and the first isolation layer 130 may be formed by deposition (e.g., PVD and CVD). Further, the gate electrode 120 also may be formed by plating, and the present invention is not limited in this regard. The thin metal layer 140 may be formed on the first isolation layer 130 by thermal evaporation. Therefore, the thin metal layer 140 may be in contact with the first isolation layer 130. In this embodiment, the thin metal layer 140 may be made of a material including silver, and the thickness H1 of the thin metal layer 140 may be in a range from 1 nm to 20 nm (e.g., 10 nm). After the formation of the thin metal layer 140, a thermal annealing treatment may be performed on the thin metal layer 140, such that the thin metal layer 140 has the metal particles 142 (e.g., nano-silver particles). In this embodiment, a temperature of the thermal annealing treatment performed on the thin metal layer 140 may be in a range from 50° C. to 300° C. For example, the thermal annealing treatment is performed at 200° C. for 1 hour.

After the formation of the metal particles 142, an indium gallium zinc oxide (IGZO) material may be formed on the metal particles 142. Because of the metal particles 142 of the thin metal layer 140, the IGZO material formed on the metal particles 142 may form the IGZO particles 150. The IGZO material may be formed on the metal particles 142 by sputtering. Therefore, the IGZO material may form the IGZO particles 150, and the IGZO particles 150 are in contact with the metal particles 142 of the thin metal layer 140. The thickness H2 of each of the IGZO particles 150 is correlated with the thickness H1 of the thin metal layer 140. In this embodiment, since the thickness H1 of the thin metal layer 140 may be in a range from 1 nm to 20 nm, the thickness H2 of each of the IGZO particles 150 may be in a range from 2 nm to 20 nm.

As a result, the arrangement of the IGZO particles 150 can be prevented from being too dense, and thus contact areas between the IGZO particles 150 are reduced. Therefore, the lateral leakage of the memory structure 100 may be effectively reduced to improve the operational stability of the memory structure 100, thereby facilitating the properties of non-volatile memories. For example, the memory structure 100 can operate in a normal status for a long time and prevent the loss of information.

After the formation of the IGZO particles 150, the second isolation layer 160 may be formed on the IGZO particles 150. In the following steps, the IGZO channel layer 170 may be formed on the second isolation layer 160, and the source/drain electrode 180 is formed on the IGZO channel layer 170.

Through the aforementioned steps, the memory structure 100 of FIG. 1 can be obtained. It is noted that connection relationships, manufacturing methods, materials, and advantages of the elements described above will not be described again herein. In the following description, the operational states of the memory structure 100 will be described.

Figure 3:
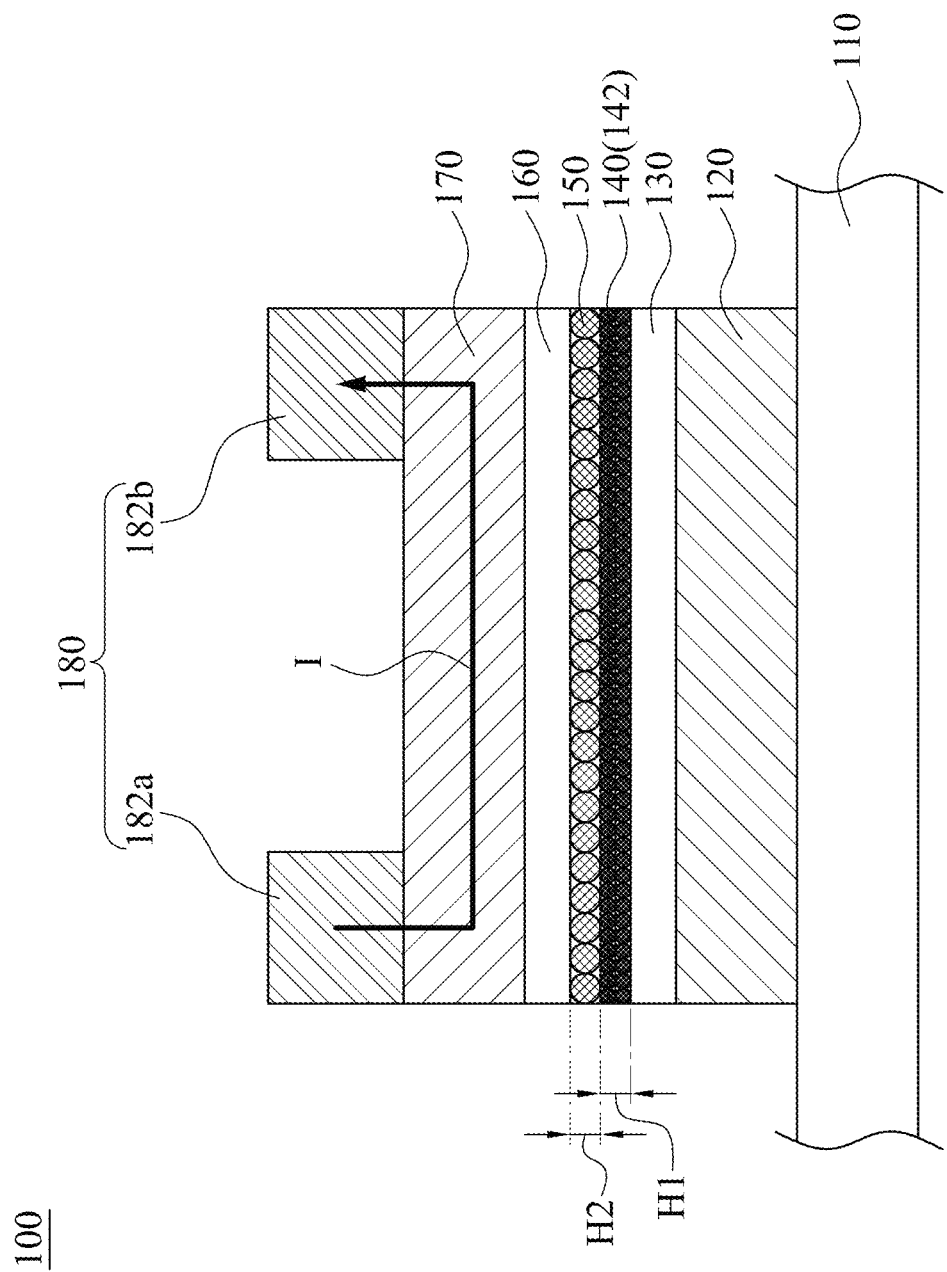
FIG. 3 is a schematic view showing a current flowing in the memory structure of FIG. 1.

FIG. 3 is a schematic view showing a current I flowing in the memory structure 100 of FIG. 1. As shown in FIG. 3, the IGZO particles 150 is used to store electric charges written in the second isolation layer 160, and does not affect the current I of the channel of a transistor. Therefore, the current I flows from the source region 182a of the source/drain electrode 180 to the drain region 182b of the source/drain electrode 180 through the IGZO channel layer 170.

Figure 4:
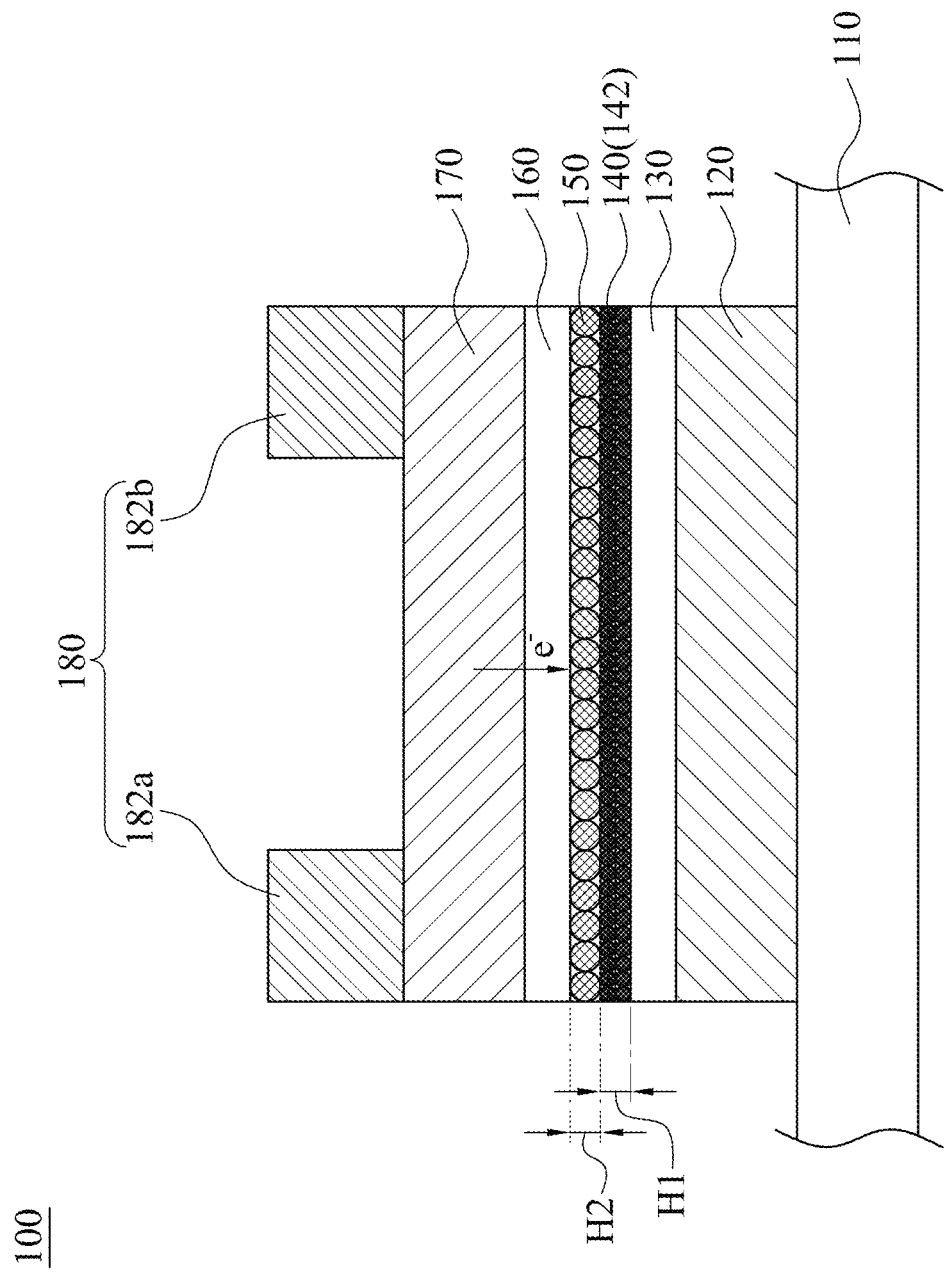
FIG. 4 is a schematic view showing a movement of an electron when writing is performed on the memory structure of FIG. 1.

FIG. 4 is a schematic view showing a movement of an electron when writing is performed to the memory structure 100 of FIG. 1. The memory structure 100 is a thin film transistor (TFT) having the IGZO channel layer 170 such that electrons may tunnel between the IGZO channel layer 170 and the IGZO particles 150 by utilizing an increased gate electric field based on quantum tunneling effect. For example, when the memory structure 100 writes information, the forward-bias gate voltage needs to be increased to enable the electrons to enter the IGZO particles 150 from the IGZO channel layer 170 by tunneling, as shown in FIG. 4. In this embodiment, the conduction band and the valence band of the IGZO material can be −4 eV and −7 eV, respectively.

Figure 5:
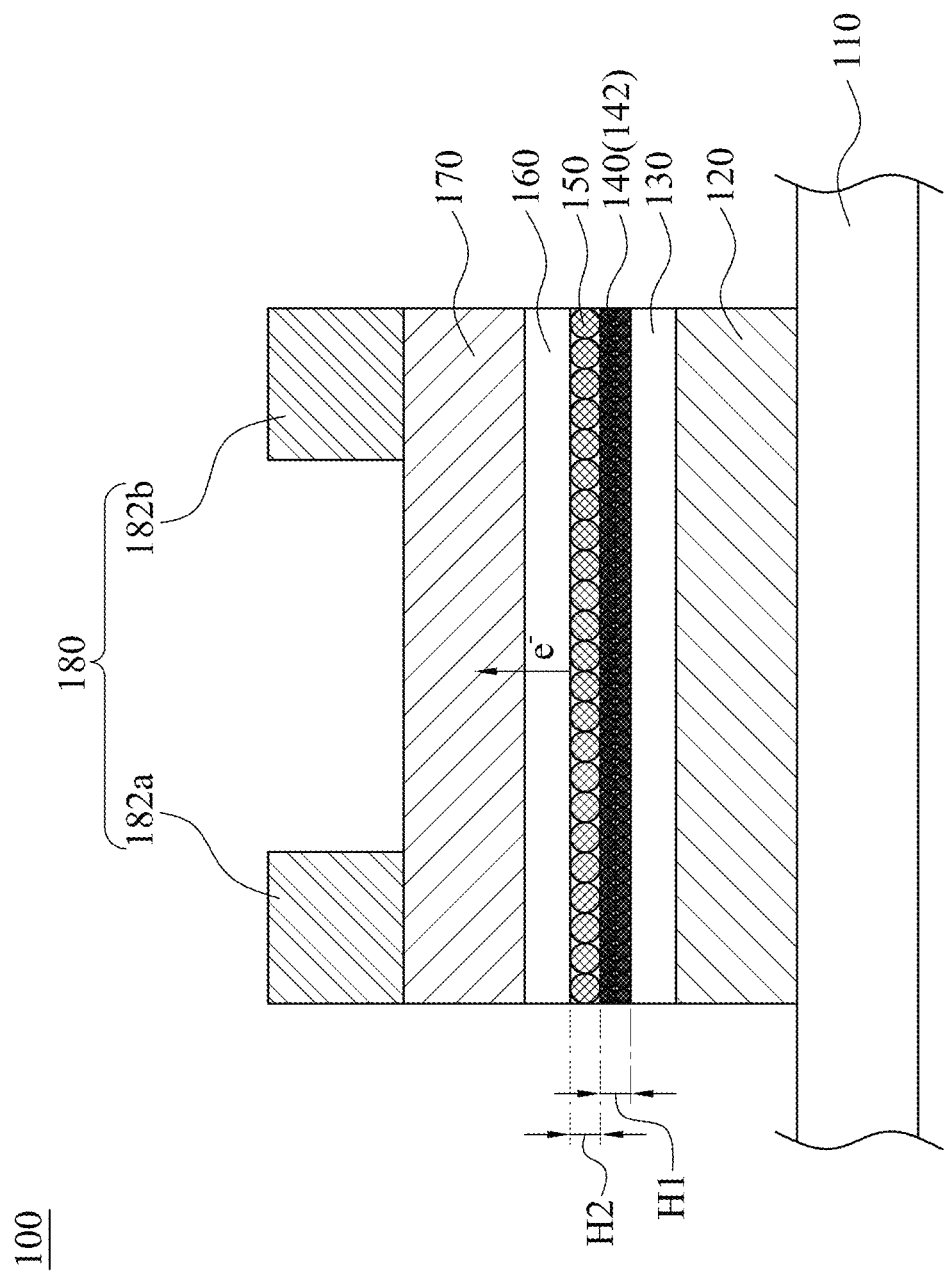
FIG. 5 is a schematic view showing a movement of an electron when erasing is performed on the memory structure of FIG. 1.

FIG. 5 is a schematic view showing a movement of an electron when erasing is performed on the memory structure 100 of FIG. 1. When the memory structure 100 erases information, the reverse bias gate voltage needs to be increased to enable the electron to return the IGZO channel layer 170 from the IGZO particles 150 by tunneling, as shown in FIG. 5.

As shown in FIG. 4 and FIG. 5, in other words, when the memory structure 100 is in operation, a large forward-bias gate voltage may be applied to enable charge carriers (electrons) to enter and store in the IGZO particles 150 from the IGZO channel layer 170 by tunneling; when information is desired to be reset, a large reverse-bias gate voltage may be applied to enable charge carriers (electrons) to return to the IGZO channel layer 170 from the IGZO particles 150 by tunneling.

Figure 6:
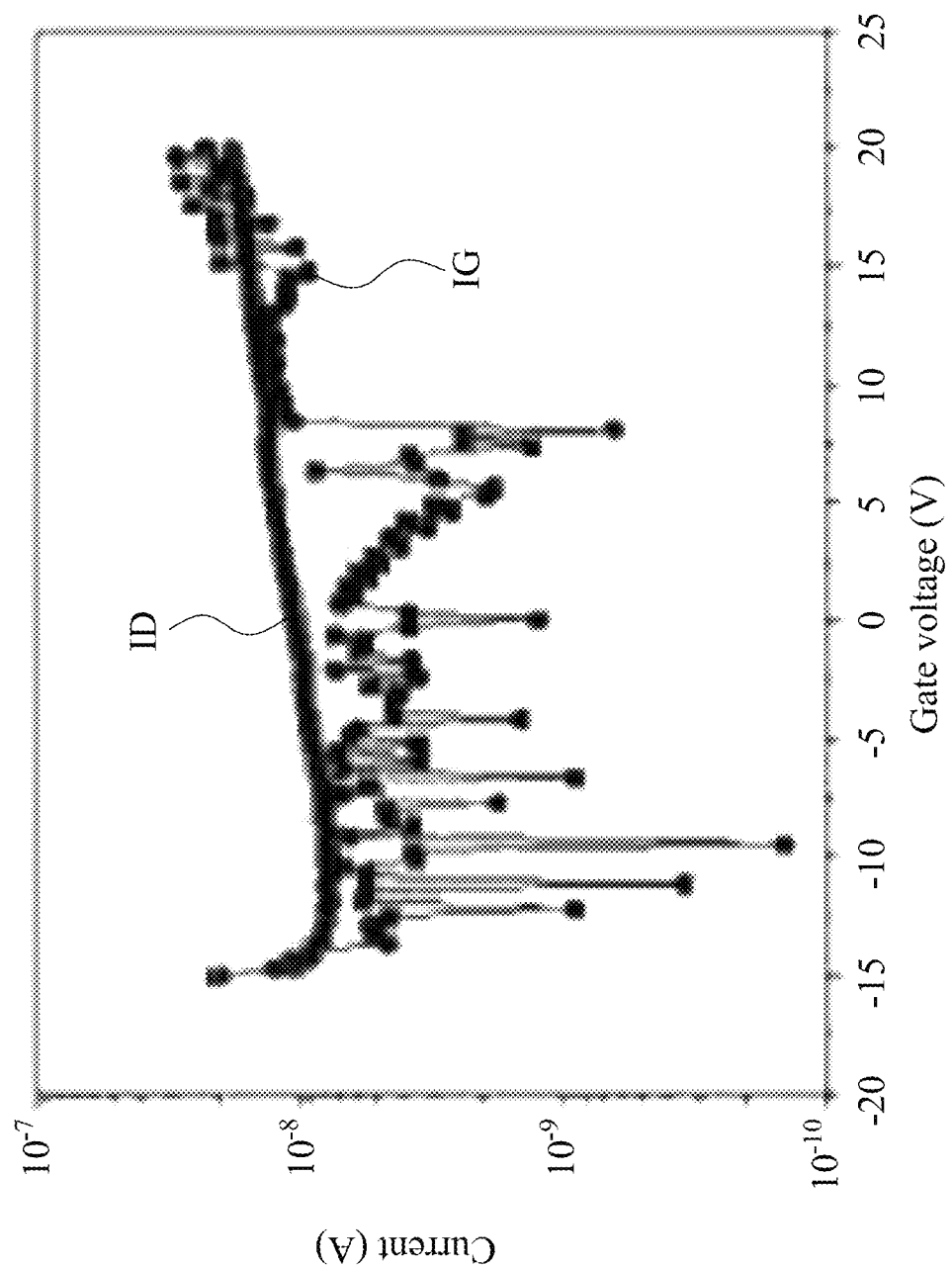
FIG. 6 is a chart showing a current to gate voltage relationship in the memory structure of FIG. 1.

FIG. 6 is a chart showing a current to gate voltage relationship in the memory structure 100 of FIG. 1. As shown in FIG. 1 and FIG. 6, FIG. 6 shows a comparison between absolute values of drain currents ID of the memory structure 100 and absolute values of gate currents IG of the memory structure 100 in a condition that the length of the IGZO channel layer 170 is 300 μm and the voltage of the drain region 182b is 20V.

Based on FIG. 6, data points of the absolute values of the drain currents ID form a polyline, data points of the absolute values of the gate currents IG form another polyline, and the two polylines have substantially the same trends without an obvious gap. As a result, the aforesaid description may prove that the IGZO particles 150 of the memory structure 100 not only can act as a medium to store charge carriers (electrons) that are induced by tunneling effect, but also can reduce the lateral leakage of the memory structure 100, thereby ensuring that the memory structure 100 can operate in a normal status for a long time and the loss of information can be prevented.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A memory structure, comprising:
   a substrate;
   a gate electrode located on the substrate;
   a first isolation layer located on the gate electrode;
   a thin metal layer located on the first isolation layer and having a plurality of metal particles;
   a plurality of indium gallium zinc oxide (IGZO) particles located on the metal particles;
   a second isolation layer located on the IGZO particles;
   an IGZO channel layer located on the second isolation layer; and
   a source/drain electrode located on the IGZO channel layer.

2. The memory structure of claim 1, wherein a thickness of the thin metal layer is in a range from 1 nm to 20 nm.

3. The memory structure of claim 1, wherein a thickness of each of the IGZO particles is in a range from 2 nm to 20 nm.

4. The memory structure of claim 1, wherein the thin metal layer is made of a material comprising silver.

5. The memory structure of claim 1, wherein the IGZO particles are in contact with the thin metal layer.

6. The memory structure of claim 1, wherein the thin metal layer is in contact with the first isolation layer.

7. The memory structure of claim 1, wherein the IGZO particles are located between the thin metal layer and the second isolation layer.

8. A manufacturing method of a memory structure, the manufacturing method comprising:
   forming a thin metal layer on a first isolation layer that is on a gate electrode;
   performing a thermal annealing treatment on the thin metal layer such that the thin metal layer has a plurality of metal particles;
   forming a indium gallium zinc oxide (IGZO) material on the metal particles such that the IGZO material forms a plurality of IGZO particles;
   forming a second isolation layer on the IGZO particles;
   forming a IGZO channel layer on the second isolation layer; and
   forming a source/drain electrode on the IGZO channel layer.

9. The manufacturing method of claim 8, wherein forming the thin metal layer on the first isolation layer is performed by thermal evaporation.

10. The manufacturing method of claim 8, wherein the thermal annealing treatment is performed on the thin metal layer under a temperature in a range from 50° C. to 300° C.

11. The manufacturing method of claim 8, wherein forming the IGZO material on the metal particles is performed by sputtering.

12. The manufacturing method of claim 8, wherein a thickness of the thin metal layer is in a range from 1 nm to 20 nm.

13. The manufacturing method of claim 8, wherein a thickness of each of the IGZO particles is in a range from 2 nm to 20 nm.

14. The manufacturing method of claim 9, wherein the thin metal layer is made of a material comprising silver.

* * * * *